United States Patent
Zhan

(10) Patent No.: US 7,633,345 B2
(45) Date of Patent: Dec. 15, 2009

(54) AMPLIFIER AND THE METHOD THEREOF

(75) Inventor: Jing-Hong Conan Zhan, HsinChu (TW)

(73) Assignee: MediaTek Inc., Hsin-chu (TW)

( * ) Notice: Subject to any disclaimer, the term of this patent is extended or adjusted under 35 U.S.C. 154(b) by 63 days.

(21) Appl. No.: 11/964,103

(22) Filed: Dec. 26, 2007

(65) Prior Publication Data

US 2009/0167439 A1    Jul. 2, 2009

(51) Int. Cl.
*H03F 3/68* (2006.01)
*H03F 3/191* (2006.01)

(52) U.S. Cl. ........................ 330/295; 330/302

(58) Field of Classification Search .............. 330/292, 330/295, 302

See application file for complete search history.

(56) References Cited

U.S. PATENT DOCUMENTS 6,472,932 B2 * 10/2002 Morie et al. .............. 327/563

OTHER PUBLICATIONS

Bruccoleri et al., "Wide-Band CMOS Low-Noise Amplifier Exploiting Thermal Noise Canceling" IEEE J. Solid-State Ckts., v. 39, No. 2, Feb. 2004, pp. 275-282.

* cited by examiner

*Primary Examiner*—Steven J Mottola
(74) *Attorney, Agent, or Firm*—Thomas, Kayden, Horstemeyer & Risley

(57) ABSTRACT

An amplifier amplifying an input signal and the method thereof. The amplifier comprises an impedance matching network and a transconductor amplifier. The impedance matching network receives the input signal to perform impedance matching thereon, and comprises a first resistor, a first transistor, and a second resistor. The first resistor, receives the input signal to generate a matched signal. The first transistor coupled to the first resistor, has a channel thermal noise to establish a first noise voltage. The second resistor coupled to the first resistor and transistor, receives the channel thermal noise to establish a second noise voltage. The transconductor amplifier coupled to the impedance matching network, comprises first and second transconductor circuits. The first transconductor circuit with first transconductance, coupled to the first resistor and transistor, receives the first noise voltage to generate a first noise current. The second transconductor circuit with second transconductance, coupled in parallel to the first transconductor circuit and in series to the load, receives the second noise voltage to generate a second noise current such that the first and second noise currents cancel each other out to reduce a noise component in the output current to the load when summing up together. The first and second transconductance have the opposite signs.

21 Claims, 7 Drawing Sheets

AMPLIFIER AND THE METHOD THEREOF

BACKGROUND OF THE INVENTION

1. Field of the Invention

The invention relates in general to high speed communication, and in particular, to an amplifier and the method thereof in high speed communication.

2. Description of the Related Art

The demand for high speed communication systems remains high in the recent years. The amplifier in a high speed communication system needs to meet stringent requiems such as broadband input matching, high gain, wide bandwidth, and low noise figure (NF). In addition, it is highly desirable to implement the amplifier in CMOS technology in order to perform a high level of integration, poising design challenges arising from the inferior RF characteristics of CMOS, including large parasitic capacitance, low transconductance, and low supply voltage.

In low noise amplifier (LNA) applications, the most critical parameters are noise figure NF and linearity. Noise figure NF is defined as $10 \, Log(SNR_{in}/SNR_{out})$, with $SNR_{in}$ and $SNR_{out}$ being the input and output signal to noise ratio. Low noise amplifier typically includes a matching network immediately after an antenna to improve noise figure NF. The linearity may be defined by Third Order Input Intercept Point, representing the point at which the power in the third-order product and the fundamental tone intersect.

Two common impedance matching techniques, namely, common gate and resistive shunt feedback circuit configuration are typically used to construct the input impedance matching in LNA, providing wideband impedance matching. Both suffer from channel thermal noise of the transistor, accounted for the dominant noise source in an LNA.

Thus a need exists for an amplifier amplifying an input signal without introducing noise to the amplified signal.

BRIEF SUMMARY OF THE INVENTION

A detailed description is given in the following embodiments with reference to the accompanying drawings.

An amplifier amplifying an input signal to generate an output current is disclosed, comprising an impedance matching network and a transconductor amplifier. The impedance matching network receives the input signal to perform impedance matching thereon, and comprises a first resistor, a first transistor, and a second resistor. The first resistor, receives the input signal to generate a matched signal. The first transistor coupled to the first resistor, has a channel thermal noise to establish a first noise voltage. The second resistor coupled to the first resistor and transistor, receives the channel thermal noise to establish a second noise voltage. The transconductor amplifier coupled to the impedance matching network, comprises first and second transconductor circuits. The first transconductor circuit with first transconductance, coupled to the first resistor and transistor, receives the first noise voltage to generate a first noise current. The second transconductor circuit with second transconductance, coupled in parallel to the first transconductor circuit and in series to the load, receives the second noise voltage to generate a second noise current such that the first and second noise currents cancel each other out to reduce a noise component in the output current to the load when summing up together. The first and second transconductance have the opposite signs.

According to another embodiment of the invention, a method of amplifying an input signal to generate an output current in an amplifier is provided, comprising providing a first resistor to receive the input signal to generate a matched signal, providing a first transistor having a channel thermal noise to establish a first noise voltage, providing a second resistor receiving the channel thermal noise to establish a second noise voltage, providing a first transconductor circuit with first transconductance to receive the first noise voltage to generate a first noise current, and providing a second transconductor circuit with second transconductance to receive the second noise voltage to generate a second noise current, such that the first and second noise currents cancel each other out to reduce a noise component in the output current to the load when summing up together. The first and second transconductance have the opposite signs.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
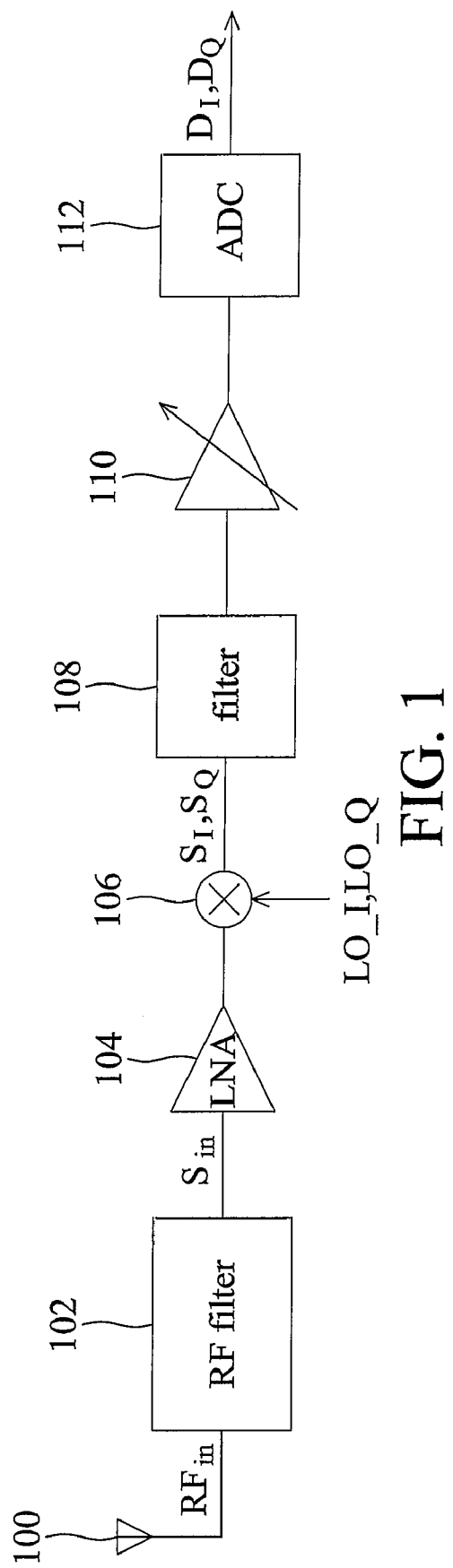
FIG. 1 is a block diagram of an exemplary receiver according to the invention.

FIG. 1 is a block diagram of an exemplary direct conversion receiver according to the invention, comprising antenna 100, RF filter 102, low noise amplifier (LNA) 104, mixer 106, filter 108, amplifier 110 and analog-to-digital converter (ADC) 112. Antenna 100 is coupled to RF filter 102, LNA 104, mixer 106, filter 108, amplifier 110, and subsequently to ADC 112.

Antenna 100 receives input signal $RF_{in}$, filtered by RF filter 102 to remove out-of-band signals, amplified by LNA 104, modulated in mixer 106 with local oscillation signals LO_I and LO_Q to produce inphase and quadrature output voltages $V_I$ and $V_Q$, which in turn are filtered by filter 108, amplified by amplifier 110, converted to digital in analog-to-digital converter 112 to generate digital data to $D_I$ and $D_Q$ for performing subsequent baseband operations. Input RF signal $RF_{in}$ comprises inphase and quadrature components, and may be a single ended signal or a differential signal pair. Local oscillation signals LO_I and LO_Q are supplied by a local oscillator (not shown) including a phase lock loop (not shown) and are 90 degree out of phase to each other. Local oscillation signals LO_I and LO_Q may also be single ended signals or differential signal pairs corresponding to input RF signal $RF_{in}$, and typically have an oscillation frequency substantially equivalent to the center frequency of input RF signal $RF_{in}$. Filter 108 may be a channel-select filter performing channel selection at intermediate frequency (IF). Amplifier 110 may be a programmable gain amplifier (PGA) amplifying filtered to change the amplifier gain thereof.

LNA 104 may be a variable gain amplifier amplifying weak RF signal $RF_{in}$ to generate an amplified RF signal without introducing noise. Mixer 106 comprises a Gilbert Cell mixer that includes a transconductor stage transforming the amplified RF signal to a current signal and a quad switching stage mixing the current signal with local oscillation signals LO_I and LO_Q.

Figure 7:
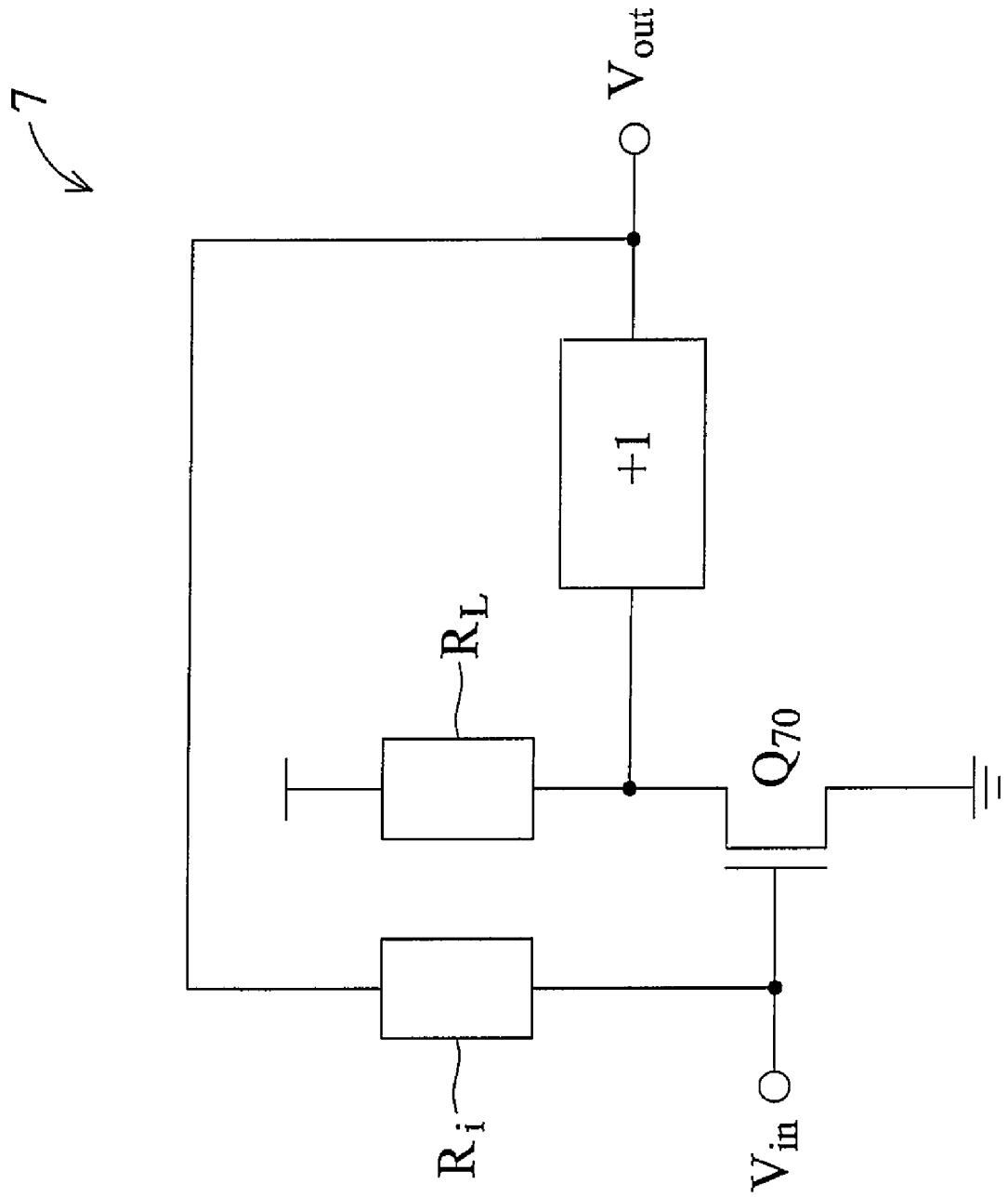
FIG. 7 is a block diagram of a conventional transconductor amplifier.

FIG. 7 is a block diagram of a conventional resistive shunt feedback transconductor, comprising feedback resistor $R_i$, load resistor $R_L$, and transistor $Q_{70}$. Feedback resistor $R_i$ is coupled between the drain and gate terminals of transistor $Q_{70}$. Load resistor $R_L$ is coupled to transistor $Q_{70}$ providing amplified output voltage $V_{out}$. Transconductor circuit 7 has a negative gain −A and input impedance Ri/(1+A). The channel thermal noise of transistor $Q_{70}$ directly contributes to a noise component in amplified output voltage $V_{out}$.

Figure 2:
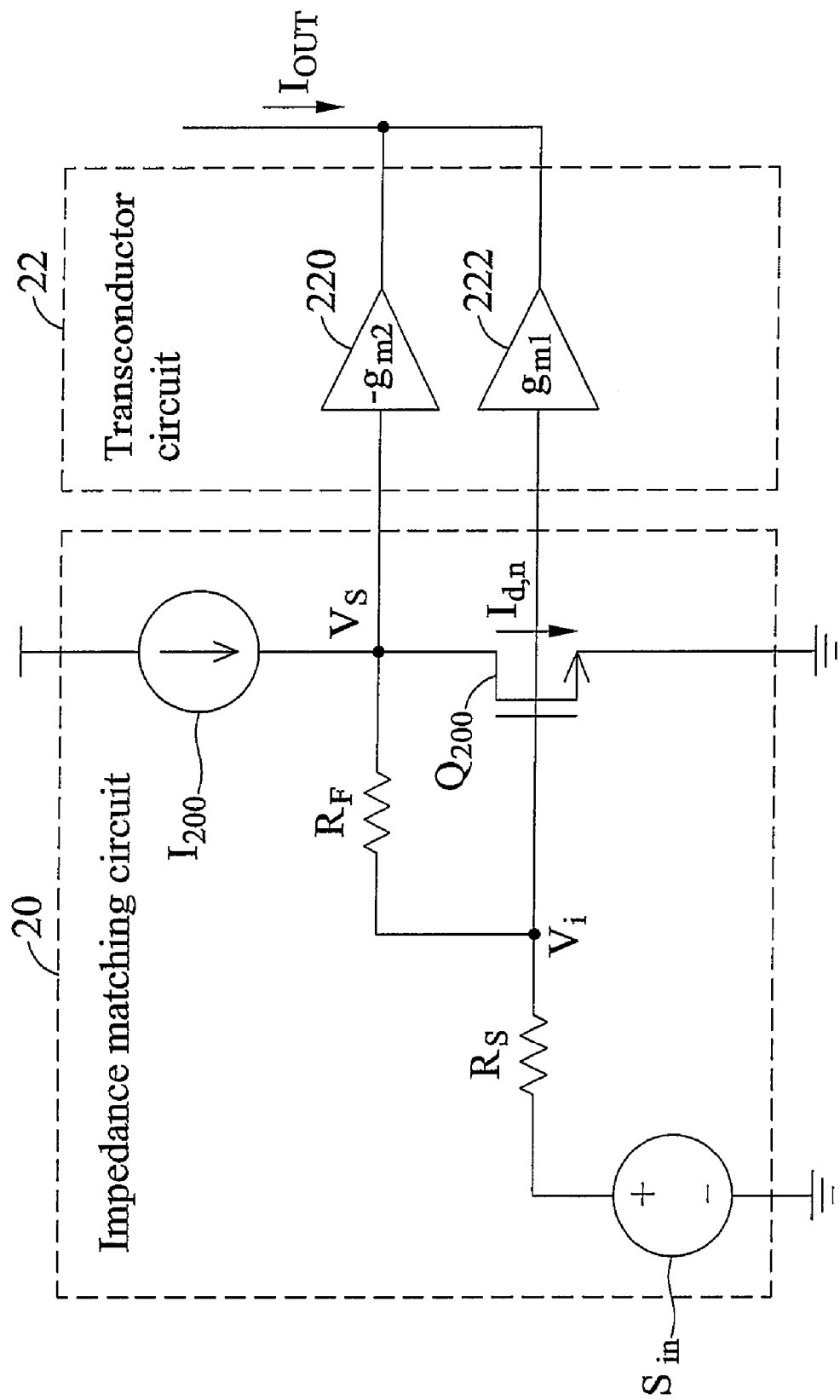
FIG. 2 is a block diagram of an exemplary transconductor amplifier according to the invention.

FIG. 2 is a block diagram of an exemplary low noise amplifier according to the invention, comprising impedance matching circuit 20 and transconductor amplifier 22 coupled thereto.

Impedance matching circuit 20 comprises first resistor RS, second resistor RF, current source 1200, and first transistor Q200. First resistor RS is coupled to second resistor RF and transistor Q200. Second resistor RF is coupled in shunt to the drain terminal of transistor Q200.

Impedance matching circuit 20 is a shunt feedback circuit with gain (−A), receiving input signal Sin to perform impedance matching thereon and producing first output voltage VS. First resistor RS is typically selected as 50 ohm to provide input impedance matching for input signal Sin and generate matched input signal Vi. Input signal Vi comprises first signal voltage Vg,s and first noise voltage Vg,n, and output voltage VS comprises second signal voltage Vd,s and second noise voltage Vd,n. Second resistor RF provides a feedback path between the drain terminal and gate terminal of first transistor $Q_{200}$. First transistor $Q_{200}$ is an NPN type MOSFET transistor receiving first signal voltage $V_{g,s}$ at the gate thereof to establish signal current $I_{d,s}$ and first signal voltage $V_{d,s}$ at the drain. First transistor $Q_{200}$ has intrinsic channel thermal noise $I_{d,n}$ arising from the random thermal motion of the carrier and the drift in the field, which is the dominant noise source in impedance matching circuit 20. Channel thermal noise $I_{d,n}$ establishes first noise voltage $V_{d,n}$ at the drain terminal and second noise voltage $V_{g,n}$ at the gate terminal of transistor $Q_{200}$.

Transconductor amplifier 22 comprises first transconductor amplifier circuit 222 and first transconductor amplifier circuit 220 coupled in parallel to each other. First transconductor amplifier circuit 222 has positive transconductance $g_{m1}$ and second transconductor 220 has negative transconductance −gm2. First transconductor amplifier circuit 222 receives input voltage $V_i$ and second transconductor 220 receives output voltage $V_S$, together establish output current $I_{OUT}$ by $(V_i*g_{m1}−V_s*g_{m2})$ Output current $I_{OUT}$ also comprises signal component $I_{out,s}$ and noise component $I_{out,n}$. Since impedance matching circuit 20 has negative gain (−A), first input signal voltage $V_{g,s}$ and second output signal voltage $V_{d,s}$ have opposite numerical signs, or, output signal voltage $V_{d,s}$ equals to $−(V_{g,s}*A)$, resulting in strengthened signal component Lot, equaling to $(V_{g,s}*g_{m1}+V_{g,s}*A*g_{m2})$. On the contrary, first input noise voltage $V_{g,n}$ and second output noise voltage $V_{d,n}$ share an identical numerical sign, or, representing $V_{g,n}$ by $(I_{d,n}*R_S)$ and $V_{d,n}$ by $(I_{d,n}*(R_S+R_F))$, producing reduced noise component $I_{out,n}$ equaling to $(I_{d,n}*R_S*g_{m1}−I_{d,n}*(R_S+R_F)*g_{m2})$. First noise current $(I_{d,n}*R_S*g_{m1})$ from first transconductor circuit 222 and second current $(I_{d,n}*(R_S+R_F)*g_{m2})$ from first transconductor circuit 220 can cancel each other out by choosing transconductance $g_{m1}$ and $g_{m2}$ according to Equation (1):

$$g_{m1}/g_{m2}=1+R_F/R_S \qquad (1)$$

thereby producing zero noise component $I_{out,n}$ in $I_{OUT}$, or, a noiseless output current.

While first conductance $g_{m1}$ is positive and second conductance $g_{m2}$ is negative in the embodiment, it would be apparent for the people in the art that negative first conductance $g_{m1}$ and positive second conductance $g_{m2}$ also serves the purpose of reducing the noise component in output current $I_{OUT}$, proper circuitry modification to the LNA in FIG. 2 can be made without deviating from the principle of the invention.

Figure 3:
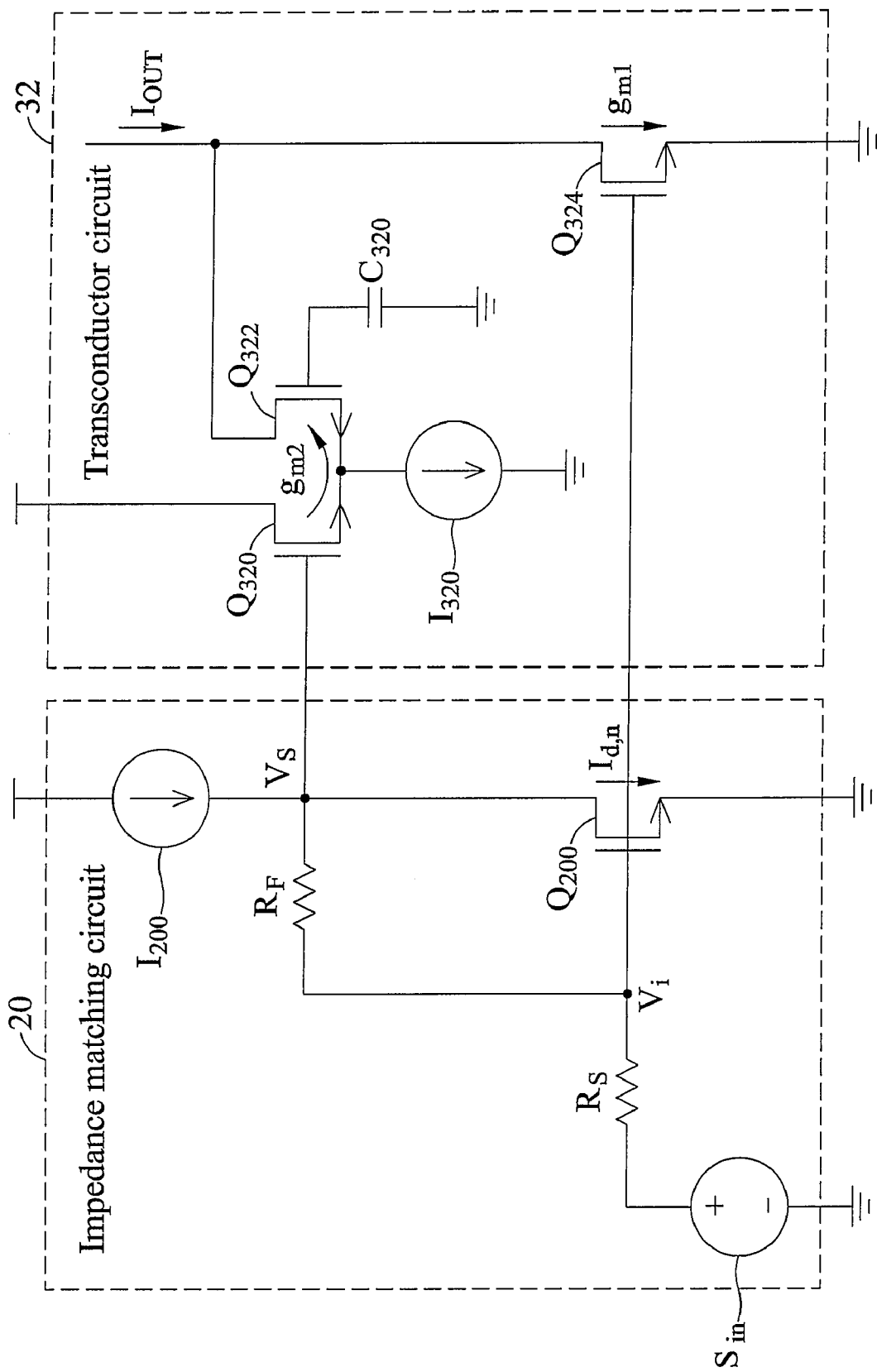
FIG. 3 is a circuit schematic of an exemplary transconductor amplifier according to the invention.

FIG. 3 is a circuit schematic of an exemplary transconductor amplifier in FIG. 2, comprising impedance matching circuit 20 and transconductor circuit 32 coupled thereto.

Impedance matching circuit 20 in FIG. 3 is identical to FIG. 2, transconductor circuit 32 comprises transistors $Q_{320}$, $Q_{322}$, $Q_{324}$, current source $I_{320}$, and capacitor $C_{320}$.

Transistor $Q_{324}$ provides positive transconductance $g_{m1}$ in the first transconductor amplifier, and transistors $Q_{320}$ and $Q_{322}$ provide negative transconductance $g_{m2}$ in the second transconductor amplifier in FIG. 2. The signal component in output current $I_{OUT}$ is $(V_{g,s}*g_{m1}+V_{g,s}*A*g_{m2})$ and the noise component is removed by selecting the first and second transconductance $g_{m1}$ and $g_{m2}$ according to Equation (1).

Figure 4:
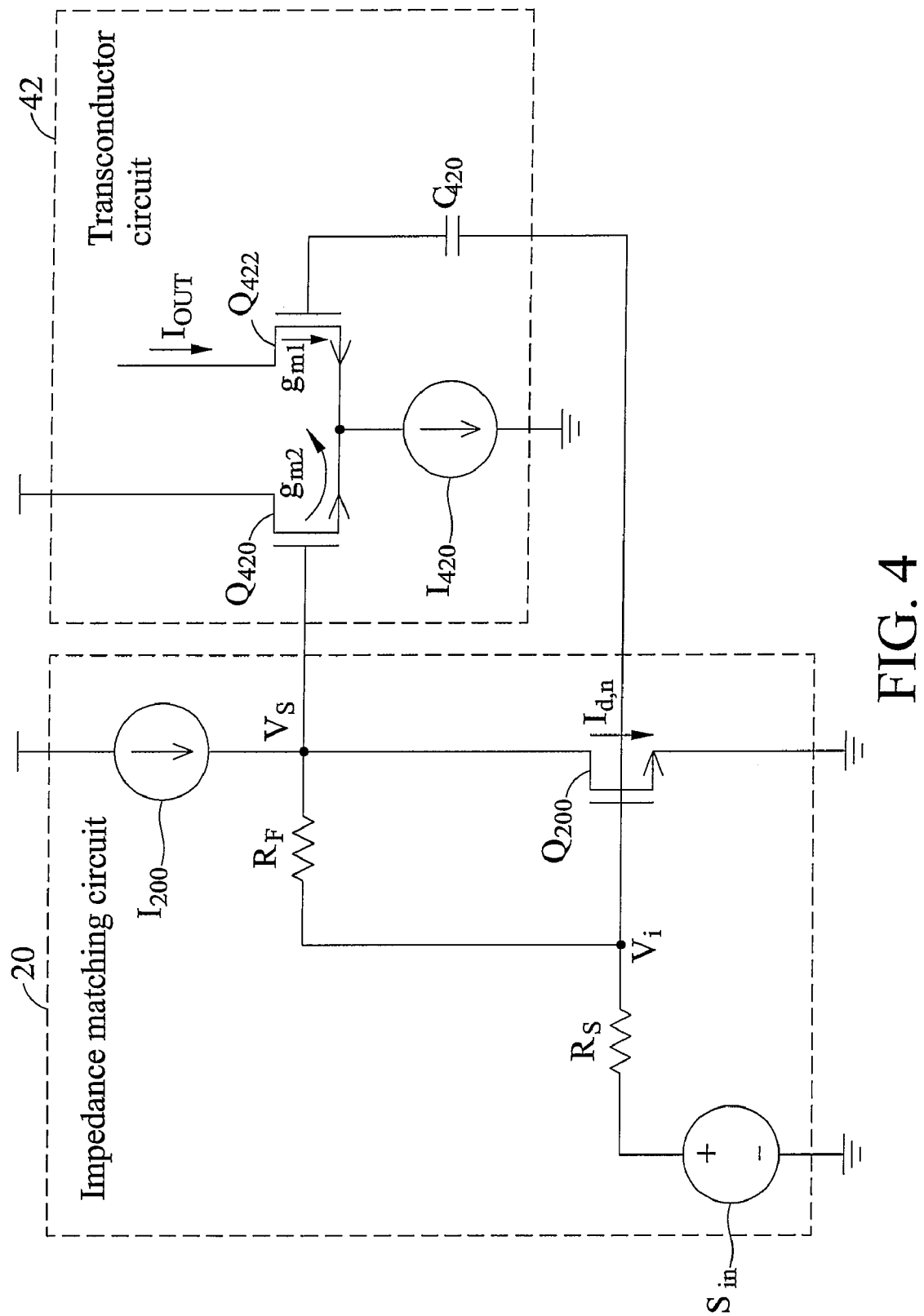
FIG. 4 is another circuit schematic of an exemplary transconductor amplifier according to the invention.

FIG. 4 is another circuit schematic of an exemplary transconductor amplifier in FIG. 2, comprising impedance matching circuit 20 and transconductor circuit 42 coupled thereto.

Impedance matching circuit 20 in FIG. 4 is identical to FIG. 2, transconductor circuit 42 comprises transistors $Q_{420}$, $Q_{422}$, current source $I_{420}$, and capacitor $C_{420}$.

Transistor $Q_{422}$ provides positive transconductance $g_{m1}$ in the first transconductor amplifier, and transistor $Q_{420}$ provides negative transconductance $g_{m2}$ in the second transconductor amplifier in FIG. 2. Transconductor circuit 42 provides better device matching than transconductor circuit 32 in FIG. 3, since transistor $Q_{422}$ providing positive transconductance $g_{m1}$ and transistor $Q_{422}$ providing negative transconductance $g_{m2}$ share a common output loading $I_{420}$. The noise component is removed by selecting the first and second transconductance $g_{m1}$ and $g_{m2}$ according to Equation (1).

Figure 5:
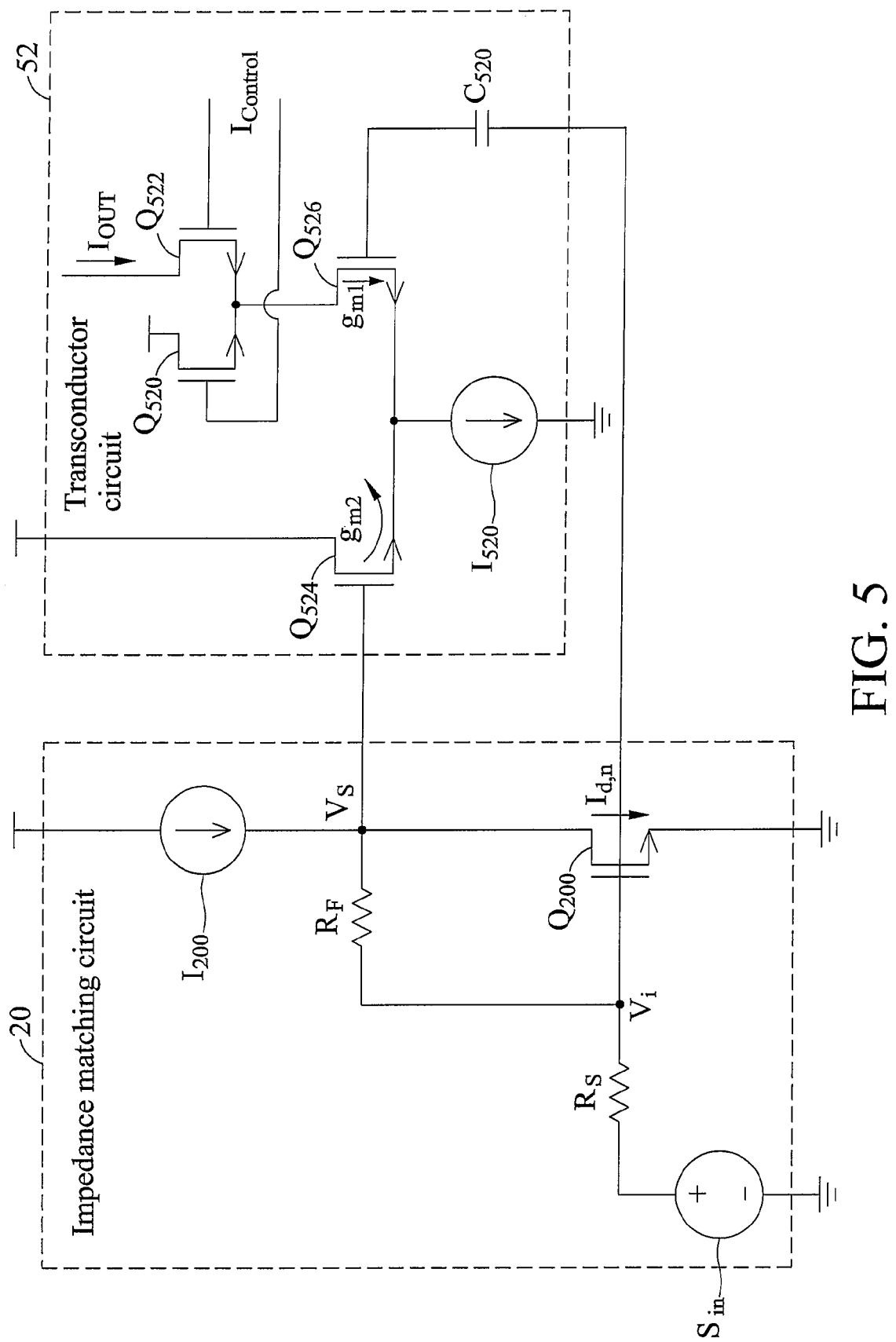
FIG. 5 is yet another circuit schematic of an exemplary transconductor amplifier according to the invention.

FIG. 5 is yet another circuit schematic of an exemplary transconductor amplifier in FIG. 2, comprising impedance matching circuit 20 and transconductor circuit 52 coupled thereto. Transconductor amplifier 5 provides a variable gain control to amplified output current $I_{OUT}$.

Impedance matching circuit 20 in FIG. 5 is identical to FIG. 2, transconductor circuit 52 comprises transistors $Q_{520}$ through $Q_{526}$, current source $I_{520}$, and capacitor $C_{520}$.

Transistor $Q_{526}$ provides positive transconductance $g_{m1}$ in the first transconductor amplifier, and transistor $Q_{524}$ provides negative transconductance $g_{m2}$ in the second transconductor amplifier in FIG. 2. Control signal $S_c$ controls transistors $Q_{520}$ and $Q_{522}$ to provide variable gain control to output current $I_{OUT}$. When Control signal $S_c$ turns transistor $Q_{520}$ on, the output current $I_{OUT}$ is reduced, providing a low gain mode. The noise component is removed by selecting the first and second transconductance $g_{m1}$ and $g_{m2}$ according to Equation (1).

Figure 6:
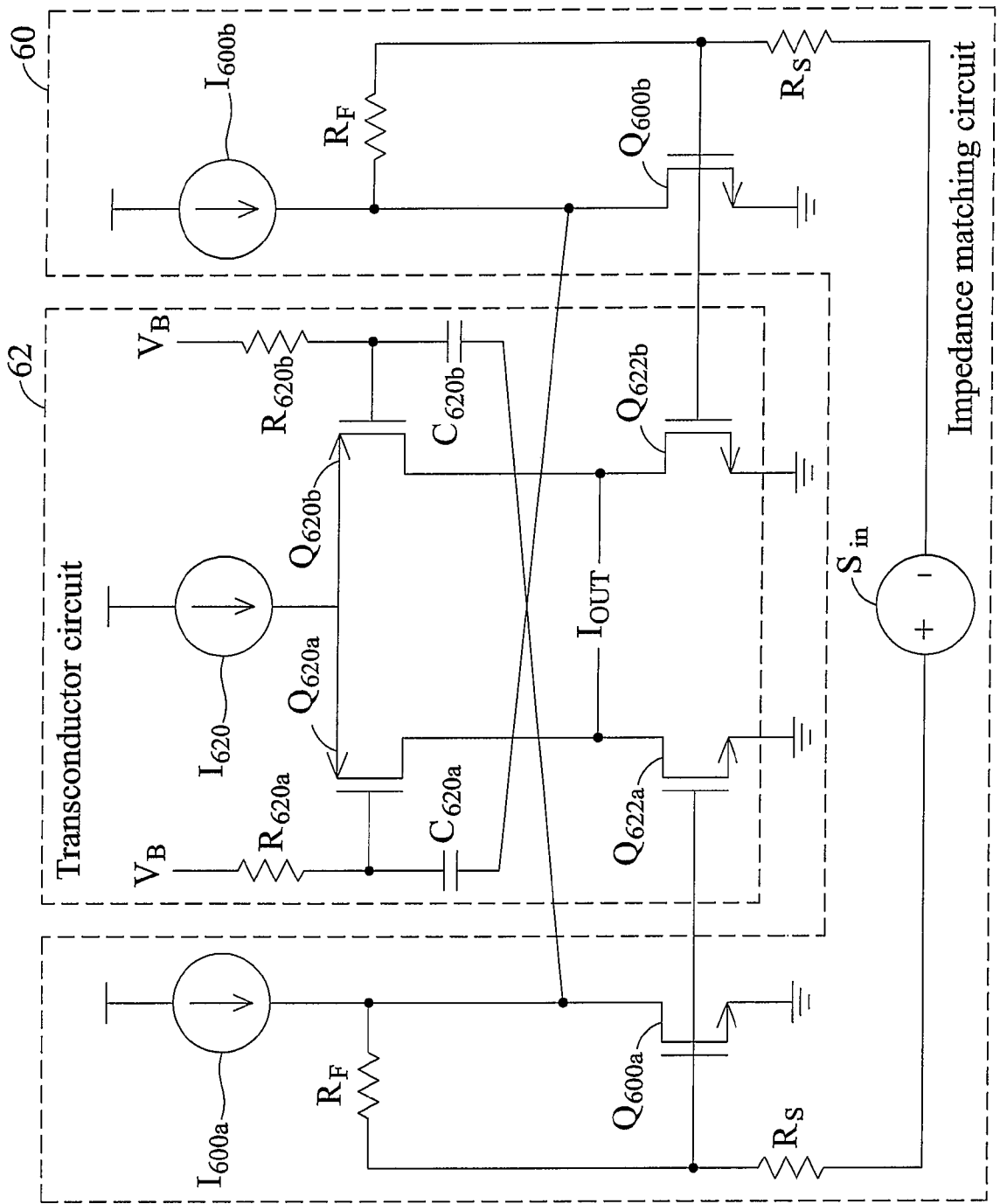
FIG. 6 is still another circuit schematic of an exemplary transconductor amplifier according to the invention.

FIG. 6 is still another circuit schematic of an exemplary transconductor amplifier in FIG. 2, comprising impedance matching circuit 60 and transconductor circuit 62 coupled thereto. Amplifier 6 is implemented in differential circuit configuration, taking a differential input pair $S_{in}$ to provide amplified output current $I_{OUT}$.

Impedance matching circuit 60. Transconductor circuit 62 comprises transistors $Q_{620a,b}$ and $Q_{622a,b}$, current source $I_{620}$, and capacitors $C_{620a,b}$.

Transistors $Q_{622a,b}$ provide positive transconductance $g_{m1}$ in the first transconductor amplifier, and transistors $Q_{622a,b}$ provide negative transconductance $g_{m2}$ in the second transconductor amplifier. The noise component is removed by selecting the first and second transconductance $g_{m1}$ and $g_{m2}$ according to Equation (1).

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An amplifier amplifying an input signal to generate an output current, comprising:
   an impedance matching network receiving the input signal to perform impedance matching thereon, comprising
      a first resistor, receiving the input signal to generate a matched signal;
      a first transistor coupled to the first resistor, having a channel thermal noise to establish a first noise voltage;
      a second resistor coupled to the first resistor and transistor, receiving the channel thermal noise to establish a second noise voltage; and
   a transconductor amplifier coupled to the impedance matching network, comprising:
      a first transconductor circuit with first transconductance, coupled to the first resistor and transistor, receiving the first noise voltage to generate a first noise current;
      a second transconductor circuit with second transconductance, coupled in parallel to the first transconductor circuit and in series to the load, receiving the second noise voltage to generate a second noise current such that the first and second noise currents mutually cancel each other out to reduce a noise component in the output current to the load; and
   wherein the first and second transconductance have the opposite signs, and the first and second transconductor circuits are operated in a current mode.

2. The amplifier of claim 1, wherein the first resistor has first resistance RS and the second resistor has second resistance RF, and the transconductor amplifier generates no noise component when the first transconductance gm1 and second transconductance gm2 meet the following relationship:

$gm1/gm2=1+RF/RS.$

3. The amplifier of claim 1, wherein the first transistor further receives the matched signal to generate an amplified signal with a negative gain, the first transconductor circuit receives the matched signal to generate a first signal current, and the second transconductor circuit receives the amplified signal to generate a second signal current such that the first and second signal currents accumulates to increase a signal component in the output current to the load when summing up together.

4. The amplifier of claim 1, wherein the first transconductance is positive and the second transconductance is negative.

5. The amplifier of claim 1, wherein:
   the first transistor having a first gate, a first drain, and a first source;
   the first transconductor circuit comprises a second transistor having a second gate coupled to the first gate, a second drain, and a second source coupled to the ground,
   the second transconductor circuit comprises:
      a third transistor having a third gate coupled to the first drain, a third drain coupled to a voltage source, and a third source coupled to a current source; and
      a fourth transistor having a fourth gate coupled to the ground through a capacitor, a fourth drain coupled to the second drain, and a fourth source coupled to the third source and the current source.

6. The amplifier of claim 1, further comprising a third transconductor circuit, wherein:
   the first transistor having a first gate, a first drain, and a first source;
   the second transconductor circuit comprises a second transistor having a second gate coupled to the first gate, a second drain, and a second source coupled to a current source,
   the third transconductor circuit comprises a third transistor having a third gate coupled to the first drain, a third drain coupled to a voltage source, and a third source coupled to the second source and the current source.

7. The amplifier of claim 6, further comprising:
   a fourth transistor having a fourth gate, a fourth drain coupled to the voltage source, and a fourth source coupled to the second drain; and
   a fifth transistor having a fifth gate, a fifth drain, and a fifth source coupled to the second drain.

8. The amplifier of claim 1, wherein the input signal is a differential signal pair, the circuit components in the impedance matching network and the transconductor amplifier are constructed by transistor pairs.

9. A method of amplifying an input signal to generate an output current in an amplifier, comprising:
   providing a first resistor to receive the input signal to generate a matched signal;
   providing a first transistor having a channel thermal noise to establish a first noise voltage;
   providing a second resistor receiving the channel thermal noise to establish a second noise voltage; and
   providing a first transconductor circuit with first transconductance to receive the first noise voltage to generate a first noise current; and
   providing a second transconductor circuit with second transconductance to receive the second noise voltage to generate a second noise current, such that the first and second noise currents mutually cancel each other out to reduce a noise component in the output current to the load; and
   wherein the first and second transconductance have the opposite signs, and the first and second transconductor circuits are operated in a current mode.

10. The method of claim 9, wherein the first resistor has first resistance RS and the second resistor has second resistance RF, and the transconductor amplifier generates no noise component when the first transconductance gm1 and second transconductance gm2 meet the following relationship:

$gm1/gm2 =1+RF/RS.$

11. The method of claim 9, further comprising:
    the first transistor receiving the matched signal to generate an amplified signal with a negative gain, the first transconductor circuit receiving the matched signal to generate a first signal current; and
the second transconductor circuit receiving the amplified signal to generate a second signal current such that the first and second signal currents accumulates to increase a signal component in the output current to the load when summing up together.

12. The method of claim 9, wherein the first transconductance is positive and the second transconductance is negative.

13. The method of claim 9, wherein:
the first transistor having a first gate, a first drain, and a first source;
the first transconductor circuit comprises a second transistor having a second gate coupled to the first gate, a second drain, and a second source coupled to the ground,
the second transconductor circuit comprises:
a third transistor having a third gate coupled to the first drain, a third drain coupled to a voltage source, and a third source coupled to a current source; and
a fourth transistor having a fourth gate coupled to the ground through a capacitor, a fourth drain coupled to the second drain, and a fourth source coupled to the third source and the current source.

14. The method of claim 9, further comprising providing a third transconductor circuit, wherein:
the first transistor having a first gate, a first drain, and a first source;
the second transconductor circuit comprises a second transistor having a second gate coupled to the first gate, a second drain, and a second source coupled to a current source,
the third transconductor circuit comprises a third transistor having a third gate coupled to the first drain, a third drain coupled to a voltage source, and a third source coupled to the second source and the current source.

15. The method of claim 14, further comprising:
a fourth transistor having a fourth gate, a fourth drain coupled to the voltage source, and a fourth source coupled to the second drain; and
a fifth transistor having a fifth gate, a fifth drain, and a fifth source coupled to the second drain.

16. The method of claim 9, wherein the input signal is a differential signal pair, the circuit components in the impedance matching network and the transconductor amplifier are constructed by transistor pairs.

17. An amplifier amplifying an input signal to generate an output current, comprising:
a first transconductor circuit, coupled to a first resistor and a first transistor, receiving a first noise voltage to generate a first noise current; and
a second transconductor circuit, coupled in parallel to the first transconductor circuit and in series to a load, receiving a second noise voltage to generate a second noise current, such that the first and second noise currents mutually cancel each other so as to reduce a noise component in the output current to the load, and the first and second transconductor circuits are operated in a current mode.

18. An amplifier amplifying an input signal to generate an output current, comprising:
an impedance matching network receiving the input signal to perform impedance matching thereon, comprising:
a first resistor, receiving the input signal to generate a matched signal;
a first transistor coupled to the first resistor, having a channel thermal noise to establish a first noise voltage; and
a second resistor coupled to the first resistor and transistor, receiving the channel thermal noise to establish a second noise voltage; and
a transconductor amplifier coupled to the impedance matching network, comprising:
a first transconductor circuit with first transconductance, coupled to the first resistor and transistor, receiving the first noise voltage to generate a first noise current; and
a second transconductor circuit with second transconductance, coupled in parallel to the first transconductor circuit and in series to the load, receiving the second noise voltage to generate a second noise current such that the first and second noise currents mutually cancel each other out to reduce a noise component in the output current to the load,
wherein,
the first and second transconductances have the opposite signs,
the first transistor has a first gate, a first drain, and a first source,
the first transconductor circuit comprises a second transistor having a second gate coupled to the first gate, a second drain, and a second source coupled to the ground,
the second transconductor circuit comprises:
a third transistor having a third gate coupled to the first drain, a third drain coupled to a voltage source, and a third source coupled to a current source; and
a fourth transistor having a fourth gate coupled to the ground through a capacitor, a fourth drain coupled to the second drain, and a fourth source coupled to the third source and the current source.

19. An amplifier amplifying an input signal to generate an output current, comprising:
an impedance matching network receiving the input signal to perform impedance matching thereon, comprising:
a first resistor, receiving the input signal to generate a matched signal;
a first transistor coupled to the first resistor, having a channel thermal noise to establish a first noise voltage; and
a second resistor coupled to the first resistor and transistor, receiving the channel thermal noise to establish a second noise voltage; and
a transconductor amplifier coupled to the impedance matching network, comprising:
a first transconductor circuit with first transconductance, coupled to the first resistor and transistor, receiving the first noise voltage to generate a first noise current; and
a second transconductor circuit with second transconductance, coupled in parallel to the first transconductor circuit and in series to the load, receiving the second noise voltage to generate a second noise current such that the first and second noise currents mutually cancel each other out to reduce a noise component in the output current to the load; and
wherein the first and second transconductances have the opposite signs, and the input signal is a differential signal pair, the circuit components in the impedance matching network and the transconductor amplifier are constructed by transistor pairs.

20. A method of amplifying an input signal to generate an output current in an amplifier, comprising:
providing a first resistor to receive the input signal to generate a matched signal;

providing a first transistor having a channel thermal noise to establish a first noise voltage;

providing a second resistor receiving the channel thermal noise to establish a second noise voltage;

providing a first transconductor circuit with first transconductance to receive the first noise voltage to generate a first noise current; and providing a second transconductor circuit with second transconductance to receive the second noise voltage to generate a second noise current, such that the first and second noise currents mutually cancel each other out to reduce a noise component in the output current to the load; and wherein, the first and second transconductances have the opposite signs, the first transistor has a first gate, a first drain, and a first source, the first transconductor circuit comprises a second transistor having a second gate coupled to the first gate, a second drain, and a second source coupled to the ground, the second transconductor circuit comprises:
  a third transistor having a third gate coupled to the first drain, a third drain coupled to a voltage source, and a third source coupled to a current source; and
  a fourth transistor having a fourth gate coupled to the ground through a capacitor, a fourth drain coupled to the second drain, and a fourth source coupled to the third source and the current source.

21. A method of amplifying an input signal to generate an output current in an amplifier, comprising:

providing a first resistor to receive the input signal to generate a matched signal;

providing a first transistor having a channel thermal noise to establish a first noise voltage;

providing a second resistor receiving the channel thermal noise to establish a second noise voltage; and providing a first transconductor circuit with first transconductance to receive the first noise voltage to generate a first noise current; and providing a second transconductor circuit with second transconductance to receive the second noise voltage to generate a second noise current, such that the first and second noise currents mutually cancel each other out to reduce a noise component in the output current to the load; and wherein the first and second transconductance have the opposite signs, and the input signal is a differential signal pair, the circuit components in the impedance matching network and the transconductor amplifier are constructed by transistor pairs.

* * * * *